(12) United States Patent
Tyhach et al.

(10) Patent No.: US 7,046,037 B1
(45) Date of Patent: *May 16, 2006

(54) DIFFERENTIAL INPUT BUFFERS WITH ELEVATED POWER SUPPLIES

(75) Inventors: Jeffrey Tyhach, Sunnyvale, CA (US);
Bonnie Wang, Cupertino, CA (US);
Chiakang Sung, Milpitas, CA (US);
Khai Nguyen, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/153,676

(22) Filed: Jun. 15, 2005

Related U.S. Application Data

(63) Continuation of application No. 10/704,946, filed on Nov. 10, 2003.

(51) Int. Cl.
*H03K 19/0175* (2006.01)
(52) U.S. Cl. .................... 326/80; 326/63; 327/333
(58) Field of Classification Search .................. 326/63, 326/68, 80, 81
See application file for complete search history.

(56) References Cited

U.S. PATENT DOCUMENTS

| | | | |
|---|---|---|---|
| 5,739,681 A | * | 4/1998 | Allman .................... 323/314 |
| 6,049,229 A | * | 4/2000 | Manohar et al. ............... 326/83 |
| 6,218,858 B1 | | 4/2001 | Menon et al. |
| 6,236,231 B1 | | 5/2001 | Nguyen et al. |
| 6,252,419 B1 | | 6/2001 | Sung et al. |
| 6,292,116 B1 | | 9/2001 | Wang et al. |
| 6,335,636 B1 | | 1/2002 | Yeung et al. |
| 6,346,827 B1 | | 2/2002 | Yeung et al. |
| 6,373,278 B1 | | 4/2002 | Sung et al. |
| 6,377,069 B1 | | 4/2002 | Veenstra et al. |
| 6,400,598 B1 | | 6/2002 | Nguyen et al. |
| 6,433,579 B1 | | 8/2002 | Wang et al. |
| 6,472,903 B1 | | 10/2002 | Veenstra et al. |
| 6,483,886 B1 | | 11/2002 | Sung et al. |
| 6,515,508 B1 | | 2/2003 | Chang et al. |
| 6,535,031 B1 | | 3/2003 | Nguyen et al. |
| 6,825,692 B1 | | 11/2004 | Chung et al. |
| 2004/0061525 A1 | | 4/2004 | Tamaki |

* cited by examiner

*Primary Examiner*—Daniel D. Chang
(74) *Attorney, Agent, or Firm*—G. Victor Treyz

(57) ABSTRACT

Input buffer circuitry for handling high-speed differential input signals on an integrated circuit is provided. The input buffer circuitry may use two parallel differential input buffers with overlapping input-voltage ranges. Logic on the integrated circuit may be powered at a core-logic power supply voltage. Input-output circuitry on the integrated circuit may be powered at an input-output voltage level. To improve the performance of the input buffers in the overlap range, at least one the input buffers can be powered using a total power supply voltage drop that exceeds the core-logic power supply level. One of the input buffers may be configured to handle lower-voltage input signals. This input buffer may be powered using the input-output power supply level.

20 Claims, 11 Drawing Sheets

DIFFERENTIAL INPUT BUFFERS WITH ELEVATED POWER SUPPLIES

This application is a continuation of patent application Ser. No. 10/704,946, filed Nov. 10, 2003, which is hereby incorporated by reference herein in its entirety.

BACKGROUND OF THE INVENTION

This invention relates to input-output (I/O) circuitry for integrated circuits, and more particularly, to high-speed differential input buffers using elevated power supplies.

Input-output (I/O) circuitry is used on integrated circuits as an interface between the circuitry on the integrated circuit and external circuitry. Input-output circuitry typically includes either single-ended or differential input buffers and single-ended or differential output buffers.

Single-ended buffers are used to handle single-ended signals—i.e., signals that are referenced to ground.

Differential I/O buffers are used to handle differential signals. With differential signaling schemes, a pair of signal wires carries the signals between an external component and the integrated circuit. A pair of I/O pads on the integrated circuit is used to route the differential signals to or from associated differential I/O buffers on the integrated circuit.

Differential signals are referenced to each other, rather than a source of ground potential. One of the differential signals in each differential signal pair may be labeled "positive" and the other one of the differential signals in that pair may be labeled "negative."

The average input voltage of a differential signal is called its "common mode" voltage. Different types of differential signaling schemes impose different constraints on the average signals level of the differential signal pair (i.e., its common mode voltage) and on the maximum difference between the positive and negative signals.

In relatively flexible input-output schemes such as the well-known low-voltage-differential-signaling (LVDS) scheme, the common mode voltage of the differential input signal is allowed to fall anywhere within a fairly large range. While this flexibility is advantageous for system designers, it poses challenges for designers of input-output buffer circuitry.

For example, known high-speed differential input buffers on programmable logic devices have been designed to accommodate a wide range of common-mode voltages by using multiple input buffers arrayed in parallel. The task of handling the differential input signals can be shared between a high-common-mode-voltage input buffer and a low-common-mode-voltage input buffer.

These parallel programmable-logic-device differential input buffers are powered off of the power supply used to power the core logic on the programmable logic device. The voltage associated with this power supply is about 1.5 V.

Although this scheme is generally satisfactory, the delay associated with the input buffer (which is a direct measure of the input buffer's performance) is sometimes greater than desired.

It is therefore an object of the present invention to provide improved differential input buffers for integrated circuits.

SUMMARY OF THE INVENTION

Input buffer circuitry for integrated circuits is provided. The differential input buffer circuitry may be used to convert high-speed differential input signals such as low-voltage-differential-signaling (LVDS) input signals into single-ended logic signals for processing by core logic on an integrated circuit.

Two differential input buffers may be connected in parallel to handle the differential input signals provided to a common pair of differential input pads. One of the differential input buffers may handle higher-voltage input signals (e.g., signals with common-mode input voltages ranging from about 0.9 volts to about 3.0 volts). Another of the differential input buffers may handle lower-voltage input signals (e.g., signals with common-mode input voltages ranging from about 0 to 1.1 volts). By providing an overlap in the input-voltage range handled by each of the parallel input buffers, the entire range of common-mode input signal voltages (e.g., 0 volts to 3.0 volts) may be covered. The input buffers can be connected to the pair of differential input signal terminals alone, without any other input buffers connected in parallel. This arrangement minimizes capacitive loading effects and enhances performance.

One or both of the input buffers may be powered using total power supply voltage drops that exceed the core-logic power supply voltage. This elevated power supply voltage improves the high-speed signal performance of the input buffers in the overlap range of common-mode voltages.

One of the input buffers may have a pair of n-channel metal-oxide-semiconductor (NMOS) input transistors. The other of the input buffers may have a pair of p-channel metal-oxide-semiconductor (PMOS) input transistors. The input buffer with the PMOS input transistors may be used to handle differential input signals with lower common-mode voltages. The input buffer with the NMOS input transistors may be used to handle differential input signals with higher common-mode voltages. The input buffers may have positive and negative power supply terminals. The positive power supply terminals may be connected to the core-logic power supply voltage or the input-output power supply voltage, or other suitable voltage. The negative power supply terminals may be connected to ground, a negative power supply voltage, or other suitable voltage.

With one suitable arrangement, the NMOS input buffer may have its positive power supply terminal connected to the core-logic power supply voltage and may have its negative power supply voltage terminal connected to ground or to a negative power supply voltage (e.g., a negative power supply voltage generated by a negative charge pump on the integrated circuit). The PMOS input buffer may have its positive power supply terminal connected to the input-output power supply voltage and may have its negative power supply terminal connected to ground.

The input buffers may be controlled by control signals. For example, a current source in each input buffer may have a gate terminal that can be supplied with a control signal to turn that input buffer on or off. When the input buffers are not used, they can be turned off to conserve power.

When the input buffers are powered with power supply voltages other than the core-logic power supply voltage, level shifting circuitry may be used to ensure that control signals at the proper voltages are applied to the control terminals of the input buffers. For example, a level shifter that shifts logic signals that range from ground to the core-logic power supply level may be used to produce a corresponding level-shifted control signal. The level-shifted control signal may have a voltage that ranges (for example) from ground to the input-output power supply level. The level-shifted control signal may be used to control the current source in the PMOS input buffer (e.g., to turn the PMOS input buffer on or off).

The control signal may be produced by a programmable memory cell or other logic on the integrated circuit. The programmable memory cell may be part of the programmable memory available on a programmable logic device. The input buffer circuitry can be used on integrated circuits such as programmable logic devices or on other integrated circuits such as microprocessors, application-specific-integrated circuits, digital-signal processors, etc.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
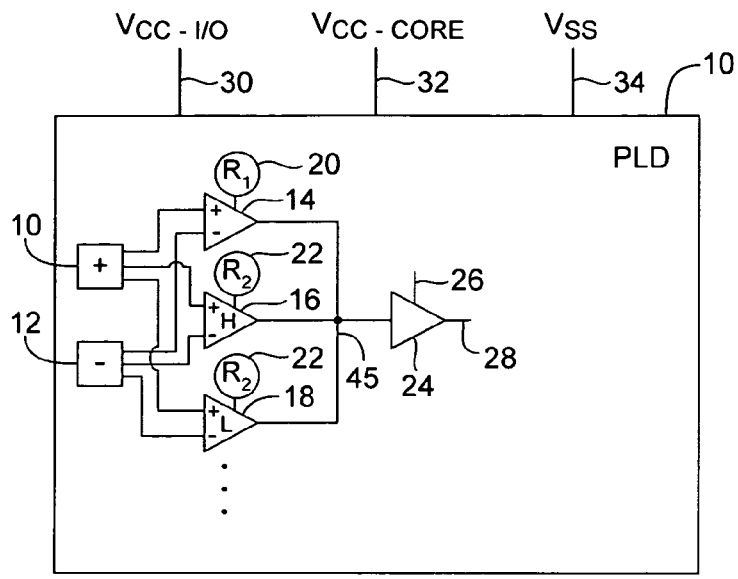
FIG. 1 is a schematic diagram of a previously-known programmable logic device having a differential input buffer.

A known programmable logic device high-speed differential input buffer arrangement is shown in FIG. 1. This type of arrangement is used in the Stratix™ family of programmable logic devices available from Altera Corporation of San Jose, Calif. Programmable logic device 10 has a number of I/O pads such as pads 10 and 12. Single-ended signals are handled by single-ended I/O circuitry (not shown). Differential signals are handled using pairs of I/O pads such as pads 10 and 12. One of the pads in each I/O pad pair may be considered to be the "positive" pad and one of the pads may be considered to be the "negative" pad.

The known programmable logic device has three parallel input buffers connected to pads 10 and 12. Input buffer 14 is designed to handle signals that use the pseudo-current-mode-logic (PCML) standard. Input buffers 16 and 18 support the low-voltage-differential-signaling (LVDS) standard and work in tandem to cover the entire allowable input voltage range (about 3 V) of common-mode voltages.

Buffer 14 can be turned on or off using configuration memory bit 20. When a logic one is provided by bit 20, buffer 14 is turned on. A logic zero may be provided by bit 20 when it is desired to turn buffer 14 off to save power.

Buffers 16 and 18 can be turned on or off together using configuration memory bit 22. When bit 22 is high, buffers 16 and 18 are turned on. Buffers 16 and 18 may be turned off when not in use to save power.

During normal operation, either buffer 14 is in operation and buffers 16 and 18 are off or buffers 16 and 18 are on and working in parallel, while buffer 14 is off.

The input to buffer 14 or to buffers 16 and 18 is differential, whereas the corresponding output at node 45 is single-ended (i.e., it is referenced to ground). The output signal from buffers 14, 16, and 18 is provided to node 45. The signal on node 45 may be provided to core logic on device 10 through a tri-state buffer 24. Control line 26 is used to control buffer 24. When buffer 24 is on, a buffered single corresponding to the signal on node 45 is provided at output terminal 28. When buffer 24 is tri-stated, the output line 28 floats, which isolates the input buffer circuitry from the rest of the circuitry on device 10.

Buffers 16 and 18 cover the entire range of expected common-mode input voltages (from about 0 to 3 V). Buffer 16 is constructed from an NMOS differential input transistor pair and is used to handle higher common-mode input voltages (e.g., from about 0.8 V and up). Buffer 18 is constructed using a PMOS differential input transistor pair and is used to handle common-mode input voltages near the bottom of the expected range (e.g., from 0 V to about 0.8 V).

Programmable logic device 10 is supplied with several different power supply voltage levels using pins such as pins 30, 32, and 34. A ground potential of 0 V (called Vss) may be provided at pin 34. A voltage of about 3.3 V (called Vcc-i/o) is used to power the single-ended I/O buffer circuitry on device 10. To reduce power consumption, device 10 (like many modern integrated circuits) uses a special low-voltage power supply to power its core logic. This voltage (Vcc-core) may be about 1.5 V.

Figure 2:
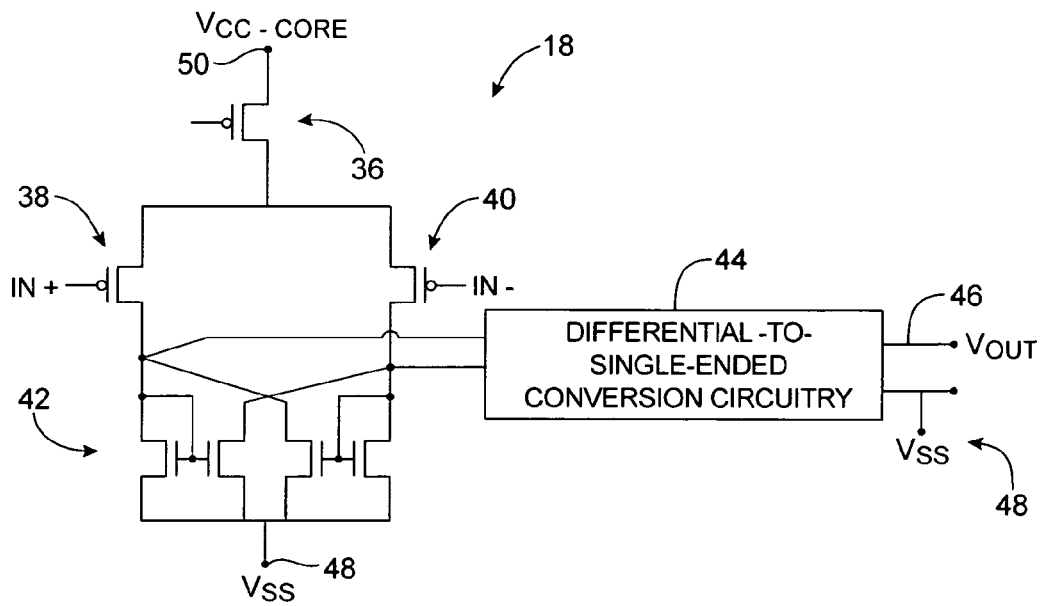
FIG. 2 is a circuit diagram of a previously-known programmable logic device integrated circuit differential input buffer.

The circuitry of buffer 18 is shown in FIG. 2. Buffer 18 and buffer 16 are powered using Vcc-core and Vss, which reduces power consumption and provides satisfactory performance at most common-mode input voltages.

Buffer 18 has differential input terminals 38 and 40 for receiving differential input signals from I/O pads 10 and 12. Transistors 42 serve load, gain, and feedback functions. Differential-to-single-ended conversion circuitry 44 converts the differential signal across transistors 42 into a single-ended signal. The single-ended signal (Vout) is provided at output 46. Because this output signal is single-ended, it is referenced to ground (Vss) 48, rather than to another active signal line. Transistor 36 of buffer 18 serves as a current source.

Figure 3:
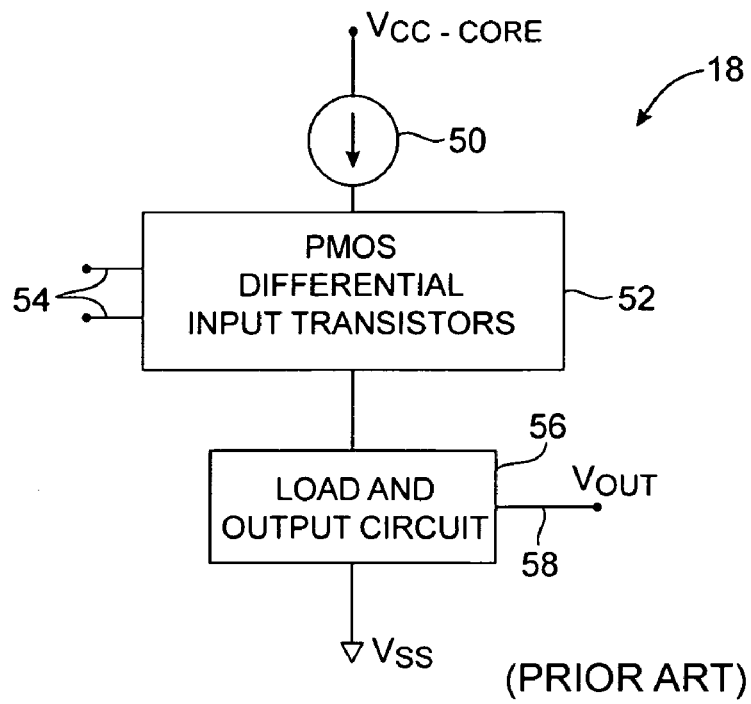
FIG. 3 is a schematic circuit diagram of a previously-known p-channel metal-oxide-semiconductor (PMOS) programmable logic device differential input buffer.

FIG. 3 shows a simplified schematic diagram of buffer 18. As shown in FIG. 3, buffer 18 has a current source 50, differential PMOS input transistors 52 for accepting a differential input signal at terminals 54, and load and output circuitry 56 for converting the differential signals in buffer 18 to a single-ended output (Vout) at terminal 58.

Figure 4:
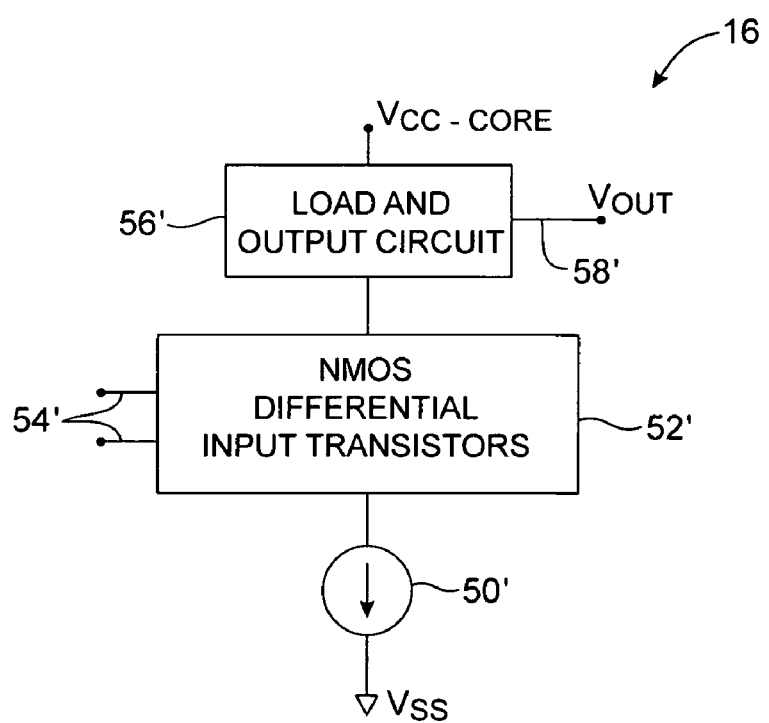
FIG. 4 is a schematic circuit diagram of a previously-known n-channel metal-oxide-semiconductor (NMOS) programmable logic device differential input buffer.

Input buffer 16 is designed to operate over a different range of common-mode voltages than buffer 18, so buffer 16 uses NMOS transistors for its differential input rather than PMOS transistors. As shown in FIG. 4, input buffer 16 has differential NMOS input transistors 52' that receive differential input signals at input terminals 54'. Buffer 16 also has current source 50' (constructed from a single transistor). Input buffer 16 has load and output circuit 56' for providing a single-ended output at terminal 58'.

Input buffers 16 and 18 are operated in tandem to receive high-speed differential input signals. Differential input signals that have high common-mode voltages (e.g., 2.5 V) are handled by high-voltage buffer 16, while low-voltage buffer 18, although electrically connected to the input, is essentially not used. Low-voltage input buffer 18 is relied upon to handle differential input signals that have low common-mode voltages (e.g., 0.3 V).

Figure 5:
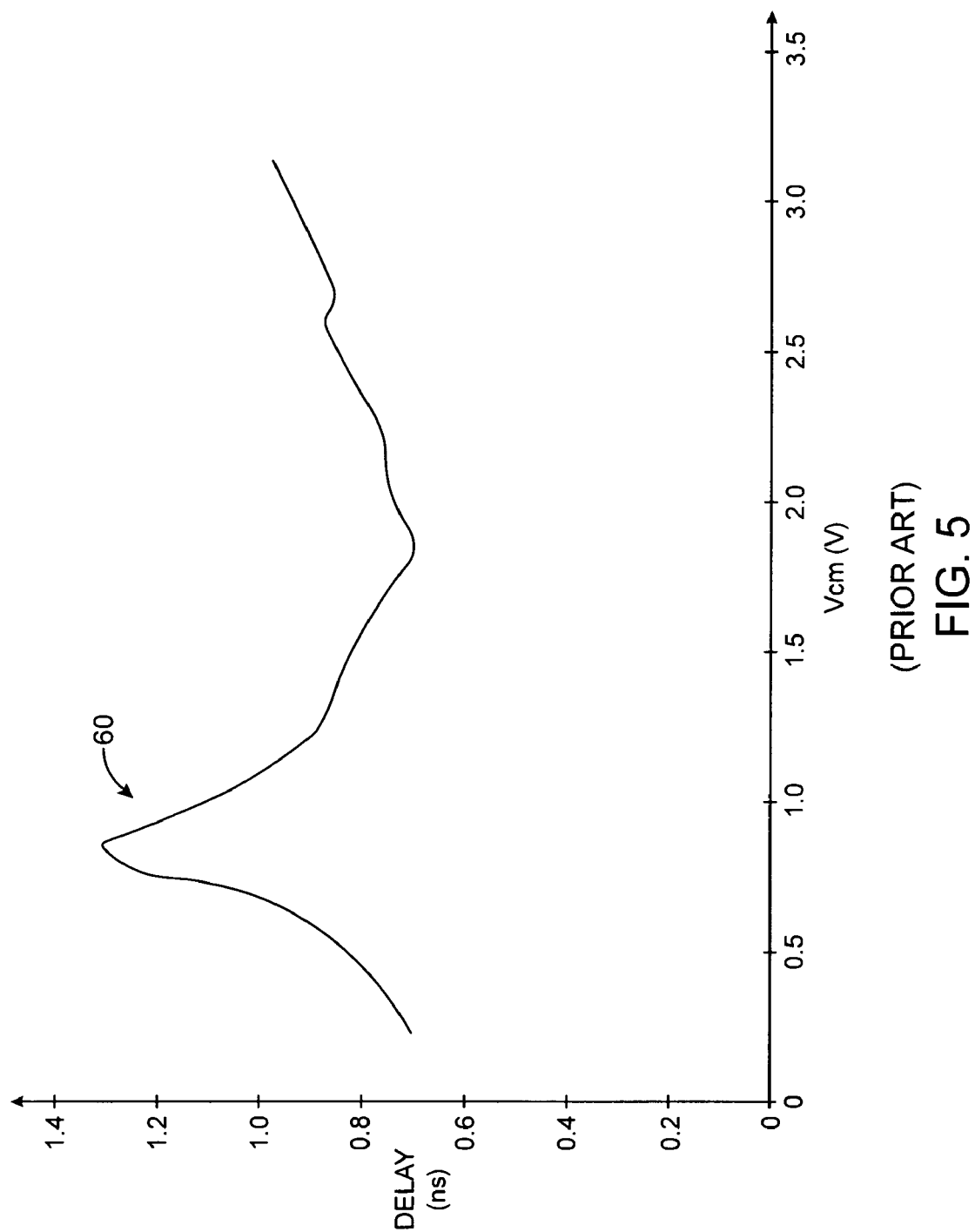
FIG. 5 is a graph showing the delay performance of the previously-known programmable logic device differential input buffer arrangement of FIG. 1.

A graph of the delay associated with passing a differential input signal through buffers 16 and 18 is shown in FIG. 5. As shown in this graph, there is a peak 60 in the measured delay of buffers 16 and 18. This peak results in a drop in the maximum permissible input signal frequency for input signals with common mode voltages in the range of about 0.7 to 1.1 V.

Peak 60 arises because the transistors in the input buffers such as current source transistor 36 and differential input transistors 38 and 40 are driven out of saturation.

Figure 6:
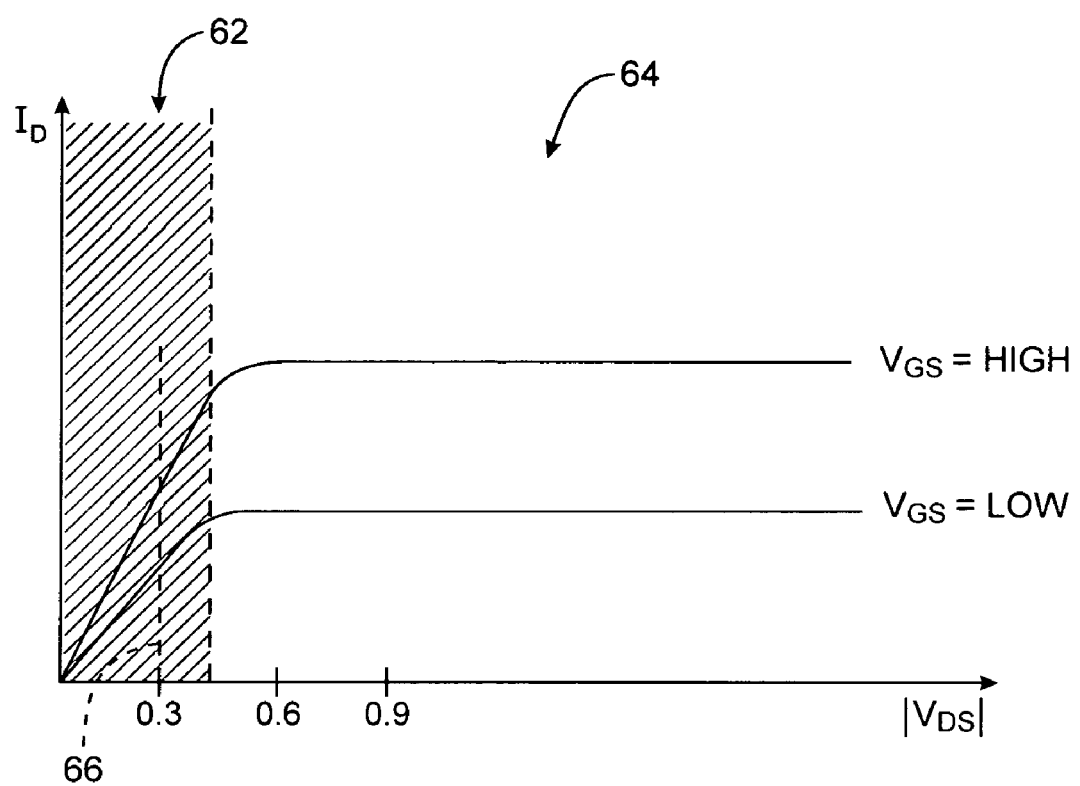
FIG. 6 is a graph showing how input buffer transistors may be forced to operate in the linear region when a differential input signal has certain common mode voltages.

A typical metal-oxide-semiconductor (MOS) drain current versus drain-source voltage plot is shown in FIG. 6. When increases in the drain-source voltage of an MOS transistor result in proportionate increases in the drain current of the transistor, the transistor is said to be in the linear operating region. The linear region of the illustrative transistor in this example is shown by the cross-hatched region 62 of FIG. 6. When further increases in the drain-source voltage of the transistor no longer result in any significant increase in the drain current, the transistor is said to be saturated. The saturation region of the illustrative transistor of FIG. 6 is shown by the non-hatched region 64.

Optimum performance of the input buffer circuitry requires that the transistors be operated in the saturation region. When the differential input transistors are operated in saturation, increases or decreases in the differential voltage across IN+ and IN− terminals results in the maximum possible output swing at the output terminal. When the transistors start to operate in the linear region, performance is degraded. In this situation, increases or decreases in the differential voltage across the IN+ and IN− terminals are only partly translated into a corresponding output signal. The gain of linear transistors is less than that of transistors in saturation, so the delay time associated with passing a signal through the buffer can rise significantly.

The current source transistors of current sources 50 and 50' and the differential input transistors 52 and 52' (FIGS. 3 and 4) must be saturated to achieve high gain and low delays. As shown in FIG. 6, however, differential input signals with common-mode input voltages of about 0.8 volts, force the transistors of input buffers 16 and 18 to operate in the linear region (e.g., with a drain-source voltage of about 0.3 V), as shown by dotted line 66.

When the common-mode input voltage of the differential input signal is about 0.8 V, the differential input transistors 52 and 52' (FIGS. 3 and 4) are weak, because they have fallen out of saturation. These input transistors have a threshold voltage Vth of about 0.7 V. For the transistors to be in saturation, they must have a voltage drop Vgs between their gates and sources that exceeds the threshold voltage Vth and the transistors must have a voltage drop Vds between their drains and sources that is greater than Vgs−Vth. In an ideal design, the drain of current source transistor 50' would be at 0 V. If the drain of transistor 50' is at 0 V, the gate voltage of the transistors in NMOS differential pair 52' of buffer 16 would be a threshold voltage higher (i.e., 0.7 V). However in an actual (non-ideal) design, the drain of the current source transistor is not at 0 V, but is governed by the equation Vds≧Vgs−Vth. This results in a drain voltage of about 0.3 V (and therefore a drain-source voltage of 0.3 V in this example), as shown by dotted line 66 of FIG. 6. Therefore, whenever the input gate voltage is less than about 1.0 V, differential input transistors 52' (the NMOS transistors in the high-common-mode-voltage input buffer 16) fall out of saturation.

Similar constraints exist for the current source transistor of current source 50 and the differential input transistors 52 of low-common-mode-voltage input buffer 18. Differential input transistors 52 also require a threshold voltage different between the drain of the current source and the gate of the input. However, as with input buffer 16, the drain of the current source 50 is not Vcc-core, but is Vcc-core−0.15 V. Because Vcc-core is about 1.5 V, the maximum allowable input gate voltage is about 1.5−0.15−0.7=0.65 V. For any input above this gate voltage, the PMOS differential input transistor pair 52 falls out of saturation.

As a result of these constraints, the performance of the low-voltage buffer 18 degrades above about 0.6 V, whereas the performance of high-voltage buffer 16 degrades below 1.0 V. When differential input signals have common-mode voltages in the range of 0.6–1.0 V increased delay times are experienced, as shown by peak 60 of FIG. 5.

In accordance with the present invention, input buffers may be provided that use larger power supply voltages. For example, in a dual input buffer arrangement in which a buffer with NMOS differential input transistors is used to handle differential input signals with relatively higher common-mode voltages and a buffer with PMOS differential input transistors is used to handle differential input signals with relatively lower common-mode voltages, the low-voltage PMOS input buffer may be operated with an elevated power supply voltage Vccn that is greater than the core power supply.

Using a value of Vccn that is greater than the core power supply level Vcc-core, increases the source-to-gate voltage of the PMOS differential pair, which extends the range of the PMOS differential pair. This pair operates at common-mode voltages below Vccn−Vth−(Vccn−Vds). If Vccn is 2.4 V, for example, this value is 1.3 V, which is significantly larger than the 0.6 V maximum operating common-mode voltage level that was handled with the previously-known buffer. If the high-voltage NMOS input buffer is operated with power supply levels of Vcc-core and Vss, it will have a lower-voltage limit of 1.0 V, which is less than the 1.3 V upper limit of the low-voltage buffer. As a result, the peak 60 of FIG. 5 is eliminated (see FIG. 11). Moreover, if the high-voltage NMOS input buffer is operated with a reduced ground potential (e.g., a negative "ground"), the lower-voltage limit of 1.0 V for this buffer can be further reduced.

Figure 7:
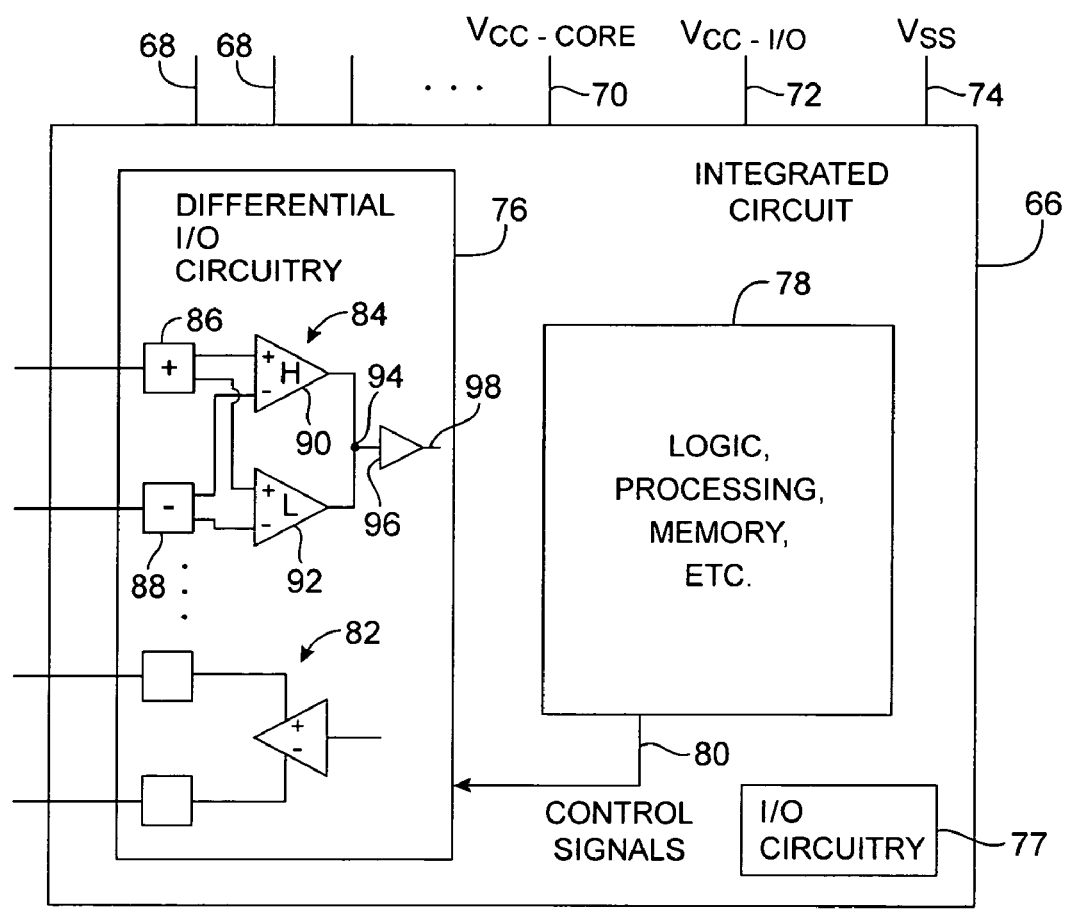
FIG. 7 is a schematic diagram of an illustrative integrated circuit having differential input buffers that exhibit low input delays in accordance with the present invention.

An illustrative integrated circuit 66 having improved high-speed differential signaling input buffer circuitry in accordance with the present invention is shown in FIG. 7. Circuit 66 may be a logic circuit, a microprocessor, a digital signal processor, an application-specific integrated circuit (ASIC), a programmable logic device integrated circuit, a memory-based circuit, or any other suitable integrated circuit that uses input buffer circuitry to handle differential input signals. Circuit 66 may have a number of input-output (I/O) pins 68 (sometimes interchangeably called "pads" herein). The pins of circuit 66 may be used to supply input and output data and control signals.

As shown in FIG. 7, the pins of circuit 66 may also include power supply pins. For example, power supply voltages of Vcc-core, Vcc-i/o, and Vss may be provided at respective pins 70, 72, and 74. Vss is typically a ground voltage of 0 V.

A modern integrated circuit may benefit from using special pins to receive power supply voltages at different levels from the board or other system component on which the circuit is mounted. The core components ("core logic") of circuit 66 operate with low power consumption and typically use a power supply voltage Vcc-core of about 1.5 V. The I/O circuitry around the periphery of the circuit needs to interface with external components. As a result, some of the I/O circuitry (e.g., low-speed single-ended I/O circuitry or other I/O circuitry 77) may be powered using higher voltages (Vcc-i/o) of about 2.5 V. The particular values of these voltages can change (e.g., downwards) as technology progresses and according to the desires of the integrated circuit designer.

Regardless of the particular values of the power supply voltages supplied to circuit 66, there is generally a benefit to powering core circuitry at lower power levels than I/O circuitry, so integrated circuit 66 preferably has input pins and power supply routing conductors to supply both lower voltages (e.g., Vcc-core for powering core logic or other components in the core of circuit 66) and higher voltages (e.g., Vcc-i/o for powering peripheral or non-core circuitry). Other power supply voltage levels can be generated using charge pump circuitry.

Integrated circuit 66 may have single-ended I/O circuitry for handling single-ended input and output signals. Integrated circuit 66 may also have differential I/O circuitry 76. Circuitry 76 may include differential output buffers such as differential output buffer 82. Circuitry 76 may also include differential input buffer circuitry such as differential input buffer circuitry 84. Only one input buffer circuit and one output buffer circuit are shown in FIG. 7 to avoid overcomplicating the drawings. In general there may be many of such circuits (e.g., 10s, 100s, or more of such circuits) on circuit 66.

Each differential input signal is received by circuit 66 using a pair of input pads such as pads 86 and 88. Differential input signals are referenced against each other, not against ground, so there are always two input signal lines associated with any differential input signal. One or more differential input signal buffers may be used to receive the differential input signal.

The purpose of the input buffers is to strengthen and condition the input signals and to convert the input signals to logic signals at the appropriate logic voltages used by circuit 66. For example, a buffer may take a differential input signal having a peak-to-peak voltage of 400 mV and a common mode voltage of 1.25 V and may convert this signal into a bit stream having high signals of 1.5 V (a logic "one") and low signals of 0 V (a logic "zero").

In some environments, it may be desirable to use two input buffers in parallel, each of which covers a part of the expected common-mode-voltage input range. This type of illustrative arrangement is shown in FIG. 7. If desired, however, only a single input buffer or more than two parallel buffers may be associated with the differential input pair 86 and 88. For clarity, the present invention will often be described in the context of an input buffer arrangement that uses a high-common-mode-voltage input buffer ("H") and a low-common-mode-voltage input buffer ("L"). This is, however, merely illustrative. Input buffer arrangements with one input buffer per differential input pad pair 86/88 or input buffer arrangements with more than two input buffers per pair 86/88 may be used if desired.

With the illustrative arrangement of FIG. 7, differential input signals supplied to circuit 66 across pads 86 and 88 may be handled using high-common-mode-voltage input buffer 90 and low-common-mode-voltage input buffer 92. The signals from pad 86 (which may be labeled "positive") may be routed to the "positive" inputs of both buffer 90 and buffer 92. The signals from pad 88 (which may be labeled "negative") may be routed to the "negative" inputs of buffers 90 and 92.

Buffers 90 and 92 work in parallel to produce single-ended output signals at common node 94 that correspond to the differential input signals received across terminals 86 and 88. The single-ended output (i.e., an output signal that is referenced to ground) may be passed to other circuitry of integrated circuit 66 via tri-state buffer 96 and output line 98.

Integrated circuit 66 has circuitry 78 such as logic circuitry, processing circuitry, memory circuits, and other circuitry for performing processing, logic, and storage functions. Circuitry 78 can generate control signals at output 80, which may be provided to differential I/O circuitry 76. The control signals may be used to turn on and off I/O buffer circuitry or to adjust the settings of circuitry 76.

Figure 8:
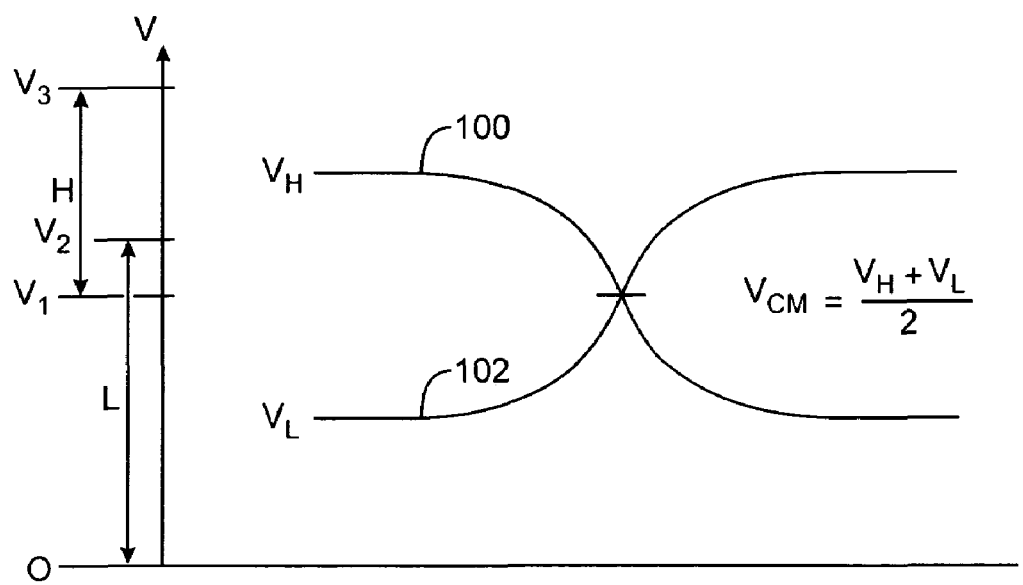
FIG. 8 is a graph showing how the common mode voltage of an input signal is defined and showing illustrative ranges of operation for high-voltage-range and low-voltage-range input buffers in accordance with the present invention.

A graph showing typical differential input signals 100 and 102 is shown in FIG. 8. Differential input signals 100 and 102 may be characterized by an upper voltage $V_H$ and a lower voltage $V_L$. The average of these, $(V_H+V_L)/2$ is the "common-mode" voltage of the differential signal.

The differential I/O input circuitry 84 may handle differential input signals having common-mode voltages in the range of 0 V to $V_3$ volts (or other suitable range). This input range may be covered by using the two buffers in tandem—H buffer 90 can handle input voltages in the range of $V_1$ to $V_3$ and L buffer 92 can handle input voltages in the range of 0 to $V_2$. Providing a good overlap between the voltages $V_1$ and $V_2$ (e.g., by selecting appropriate power supply voltages for the buffers) ensures that there will not be any significant degradation in performance in the overlap region (e.g. there will be minimal delay associated with the operation of the input buffer circuit 84 when the common-mode-voltage of the differential input signal falls between $V_1$ and $V_2$).

Figure 9:
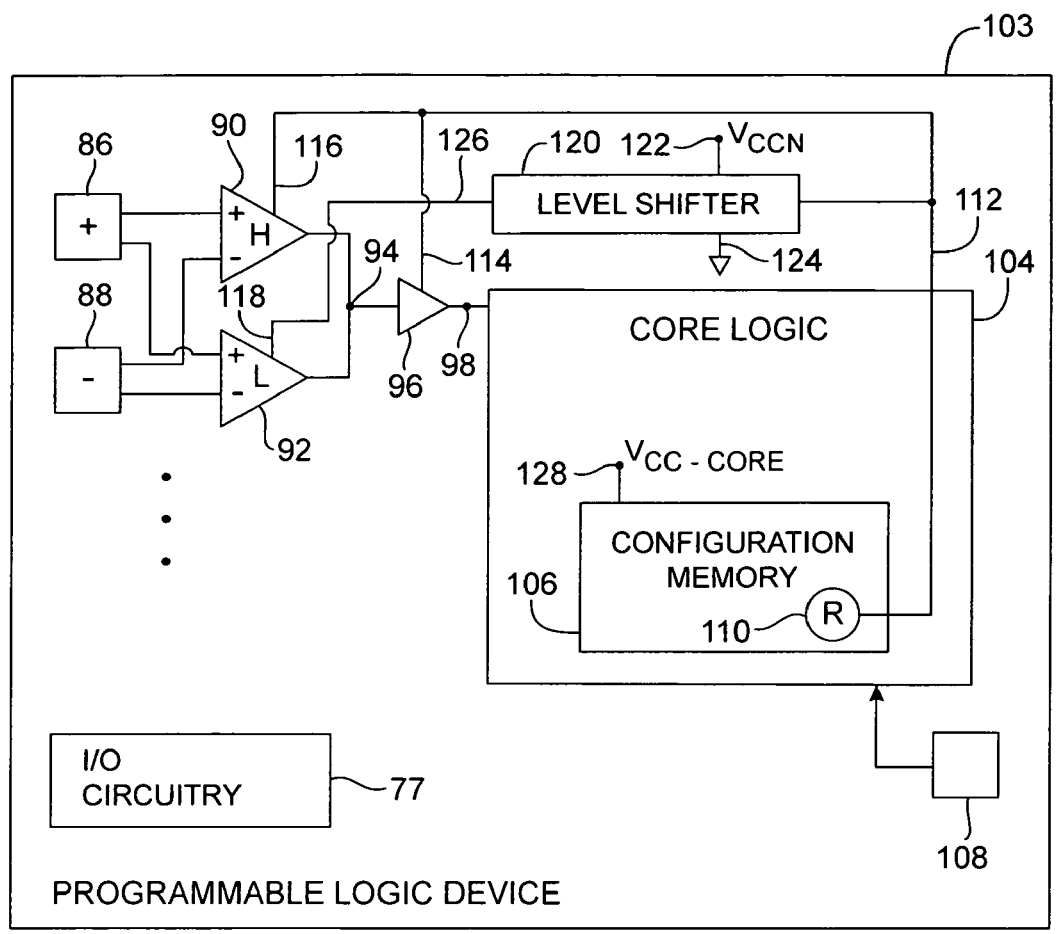
FIG. 9 is a schematic diagram of an illustrative programmable logic device having high-speed differential input buffer circuitry in accordance with the present invention.

Integrated circuit 66 may be, for example, a programmable logic device. An illustrative programmable logic device 103 having a dual-buffer differential input signal circuit is shown in FIG. 9. Programmable logic device 103 may have core logic 104. Core logic 104 may include programmable macrocells, logic array blocks, logic elements, configurable multiplexers, switches, and pass transistors, memory, etc. Core logic 104 may also have configuration memory 106 for configuring the core logic and other programmable circuitry on device 103.

The configuration memory may be loaded using an I/O pin 108. When a user desires to program programmable logic device 103, programming data (configuration data) may be loaded into configuration memory 106. The outputs of the configuration memory (i.e., the logic ones and zeros) may be used to drive the gates of pass transistors, switch transistors, etc. in the programmable logic on device 103. An illustrative memory cell 110 (labeled R because it may be a random-access memory cell or RAM cell) is shown in FIG. 9.

The output of RAM cell 110 may be used to configure the differential input circuitry. For example, the output of this configuration memory cell may be provided to control terminal inputs 116 and 118 of H buffer 90 and L buffer 92, respectively. When a high signal is applied to buffer 90 or 92, it turns that buffer on. When a low-signal is applied to the buffer, the buffer is turned off to conserve power.

Line 112 may be used to convey the output of the configuration memory cell 110 to the control inputs of the buffers 90 and 92. The configuration memory cell may be operated at a power supply level of Vcc-core. Accordingly, the output of the configuration memory cell may range from Vss (ground or 0 V) when the bit in the memory cell is a logic zero to Vcc-core (e.g., 1.5 V) when the bit in the memory cell is a logic one.

L input buffer 92 may be powered using an elevated power supply voltage Vccn that is greater than the core power supply voltage Vcc-core. This increases the headroom in buffer 92 and allows it to accommodate a wider range of input signals (i.e., the upper bound $V_2$ of FIG. 8 is higher). When buffer 92 is operated using a higher power supply voltage, a level shifter 120 may be used to raise the control signal provided on line 112 from the output of the configuration memory cell 110. Level shifter 120 may be powered by an elevated voltage Vccn that is greater than the core voltage Vcc-core. Vccn for the level shifter and the buffer 92 may be, for example, the same as Vcc-i/o, the i/o power supply voltage used for other i/o circuitry. Vccn may also be a separate power supply voltage provided through a dedicated pin or generated on programmable logic device 102 (e.g., through the use of a charge pump). Level shifter 120 may also be provided with access to ground (Vss) or other suitable lower potential at terminal 124.

In operation, memory cell 110 provides at its output either a logic low at Vss (0 V) or a logic high at Vcc-core (e.g., 1.5 V). This logic signal is provided to the input of level shifter 120 via line 112. Level shifter 120 produces a corresponding output at output 126 that is level shifted. If the input to level shifter 120 is a logic low (e.g., 0 V), level shifter 120 produces a logic low at its output 126 (e.g., 0 V). If the input to level shifter 120 is a logic high (e.g., Vcc-core), level shifter 120 produces a level-shifted output of Vccn (e.g., Vcc-i/o) at output 126. The level-shifted output (e.g., the logic high of Vccn) may be used to control buffer 92.

If desired, tri-state buffer 96 may be used to provide output signals from node 94 to core logic 104 via output line 98. Buffer 96 may be controlled via input terminal 114. Input terminal 114 may be connected to the output of configuration memory cell 110 via line 112, so that the state of cell 110 can be used to tri-state buffer 114 when buffers 90 an 92 are turned off and not needed. Tri-stating buffer 96 in this way helps to isolate the differential input circuitry from the remainder of the circuit when the input buffer circuitry is not in use. The tri-state buffer 96 may operate at Vcc-core, so that its output interfaces with core logic 104. It is therefore generally not necessary to level shift the control signal applied to control input 114.

Figure 10:
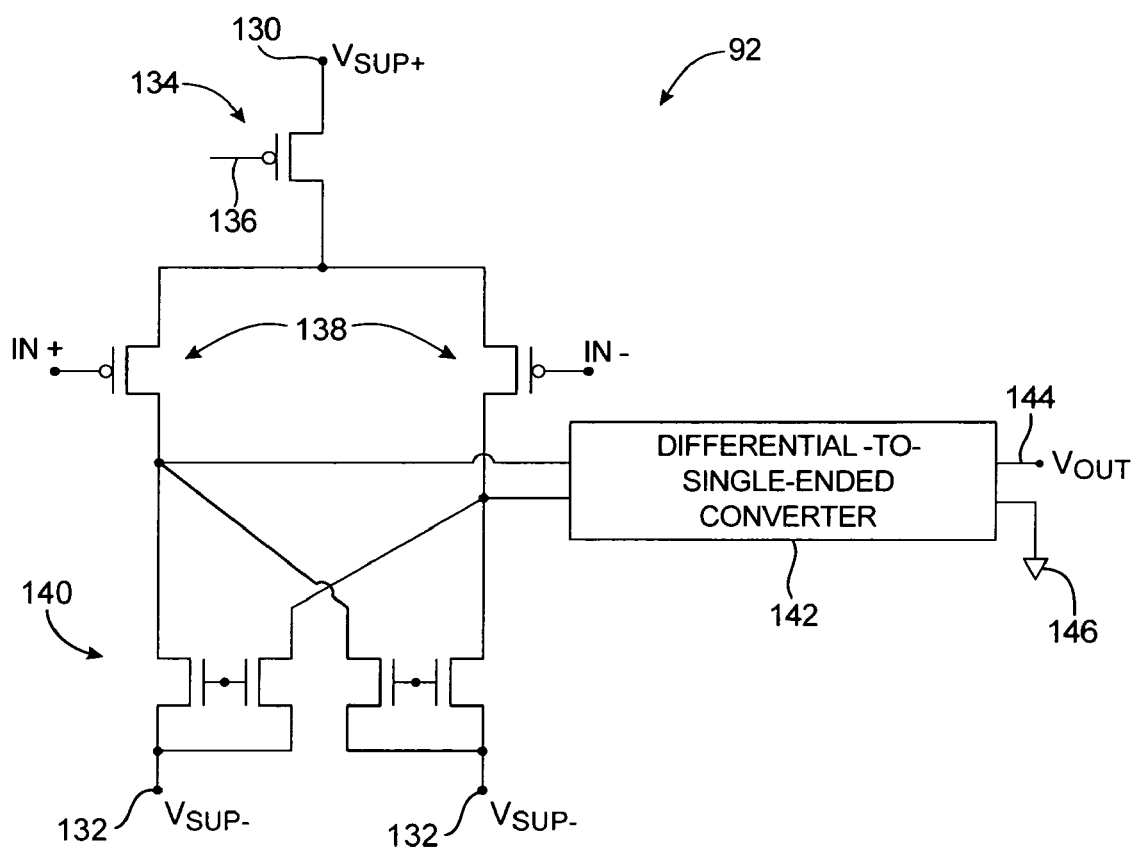
FIG. 10 is a circuit diagram of an illustrative PMOS differential input buffer in accordance with the present invention.

An illustrative low-common-mode-voltage (L) differential input signal buffer circuit 92 is shown in FIG. 10. As shown in FIG. 10, L buffer 92 may have PMOS differential input transistors 138 that receive differential input signals at terminals IN+ and IN− (which are respectively coupled to the input pads 86 and 88 that are shown in FIGS. 7 and 9). Transistor 134, which is controlled by a control signal provided to terminal 136 from level shifter output 126 and input control terminal 118 (see, e.g., FIG. 9), serves as a current source.

Transistors 140 serve as a load and also provide feedback and gain to the circuit. The differential signals that are amplified by transistors 134, 138, and 140 may be converted to single-ended logic signals using differential-to-single-ended converter 142. The output Vout at terminal 144 of converter 142 is a single-ended logic signal that is referenced with respect to ground terminal 146.

L buffer 92 of FIG. 10 may be powered with power supply voltages Vsup+ and Vsup−. In one suitable configuration, Vsup+ is an elevated power supply voltage such as Vcc-i/o and Vsup− is a ground potential Vss. By powering L buffer 92 with an elevated voltage, transistors 134 and 138 are not allowed to fall out of saturation, even if the common-mode input voltage lies in the 0.6–1 V range that previously lead to delay peak 60.

The control signal input level to transistor 134 at terminal 136 may be level shifted using level shifter 120. Even if Vsup+ is at a voltage Vcc-i/o that is elevated with respect to the core logic level Vcc-core, transistor 134 can still be turned fully on or off by using the level shifter output voltage as a control signal. The level shifter output varies between Vcc-i/o or Vss depending on the level of the input signal received from configuration memory bit 110. (If desired, the configurability of memory bit 110 may be provided using non-RAM technologies, such as fuses or antifuses, programmable read-only memory, electrically-programmable read-only memory, electrically-erasable read-only memory, etc.)

Figure 11:
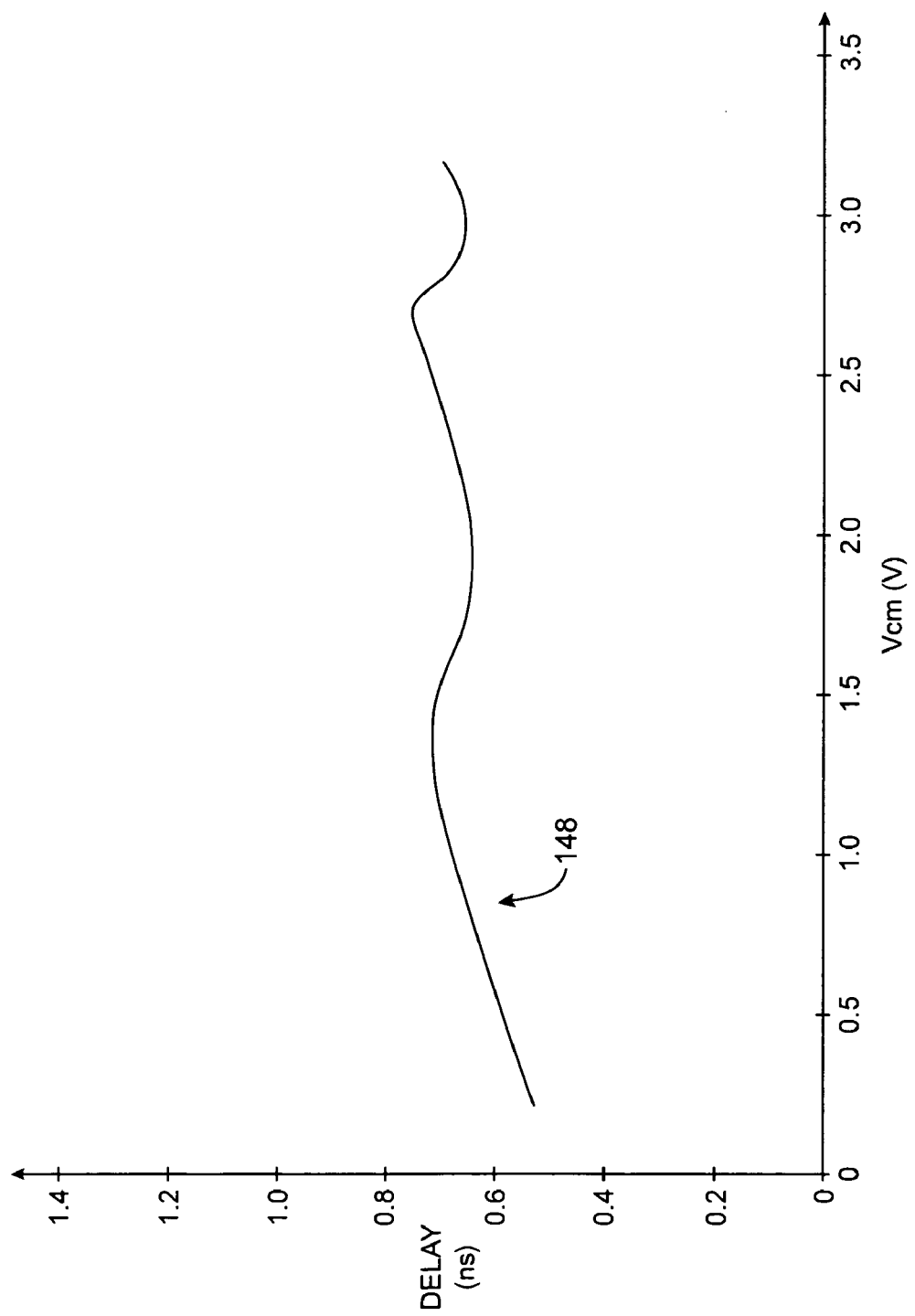
FIG. 11 is a graph showing the delay performance of the differential input buffer arrangement of FIGS. 7 and 9 in accordance with the present invention.

The measured delay through buffers 90 and 92 when buffering differential input signals using an arrangement in which buffer 92 was powered using Vcc-i/o and Vss is shown in FIG. 11. As shown in FIG. 11, there is no peak 60 in the delay characteristic in the common-mode voltage input range of 0.6–1.0 V. This allows circuits with input buffers such as buffers 90 and 92 to service higher-speed signals (e.g., signals with speeds of above 1 Gbps or more).

If desired, the performance of the H buffer 90 may be improved by extending its power supply voltage range.

Figure 12:
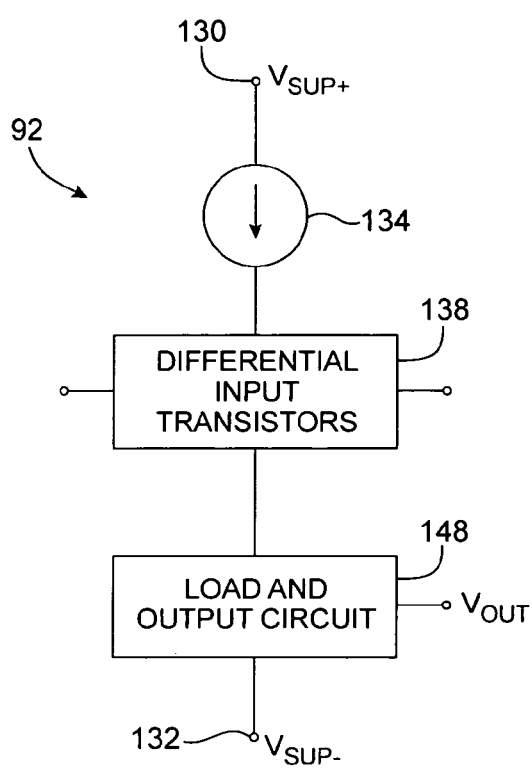
FIG. 12 is a schematic circuit diagram of an illustrative PMOS differential input buffer circuit in accordance with the present invention.
Figure 13:
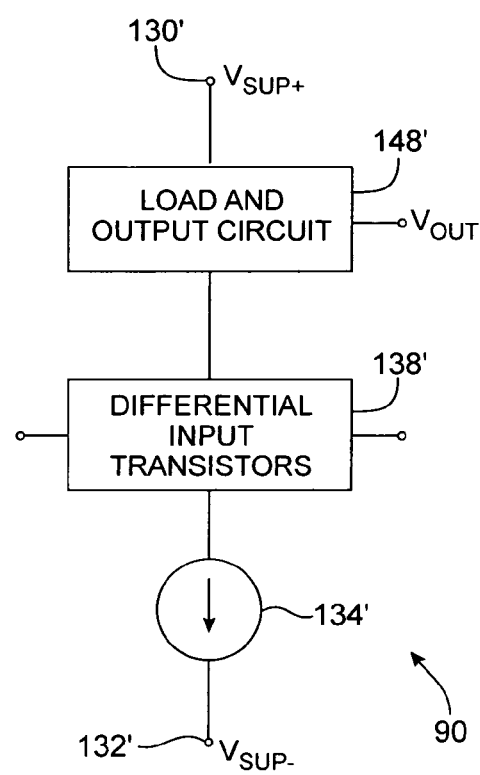
FIG. 13 is a schematic circuit diagram of an illustrative NMOS differential input buffer circuit in accordance with the present invention.

Simplified schematic circuit diagrams of L buffer 92 and H buffer 90 are shown in FIGS. 12 and 13. As shown in FIG. 12, L buffer 92 has a current source 134, differential input transistors 138 (e.g., PMOS differential input transistors), and circuitry 148 that serves load and output functions. The circuit has a upper voltage supply of Vsup+ and a lower voltage supply of Vsup−.

As shown in FIG. 13, H buffer 90 is similar in structure to L buffer 92. H buffer 90 has a current source 134', differential input transistors 138' (e.g., NMOS differential input transistors) and load and output circuit 148'. H buffer 90 is powered by voltages VSUP+ and VSUP−, which may be the same as or different than the voltages used to power L buffer 92.

To improve the lower-voltage performance of the input buffer circuitry, the upper voltage Vsup+ applied to terminal 130 of L buffer 92 may be raised relative to the core voltage Vcc-core. The lower voltage Vsup− on terminal 132 of the L buffer 92 may be set to Vss (0 V) or to another suitable voltage (e.g., 0.1 V or −0.1 V, etc.). Because of the extra headroom created by increasing the magnitude of the voltage drop across the L buffer 92 relative to the voltage drop in the core (Vcc-core to Vss), the L buffer is able to perform better than previous differential input buffers. When used in dual-input-buffer circuits such as the arrangements shown in FIGS. 7 and 9, the increase in the upper limit of the L buffer ($V_2$ of FIG. 8) helps the L buffer overlap better with the H buffer's lower limit. This reduces delay-induced performance penalties in the overlap region between the buffers.

If desired, the performance of the H buffer 90 (e.g., its lower input limit $V_1$ of FIG. 8) may be enhanced by decreasing the voltage Vsup– that is used at terminal 132'. For example, the value of Vsup+applied at terminal 130' may be set to Vcc-core and Vsup– may be set to –1 V. Decreasing Vsup– in H buffer 90 creates more headroom and allows H buffer 90 to handle a wider range of common-mode-voltage inputs than would otherwise be possible.

Figure 14:
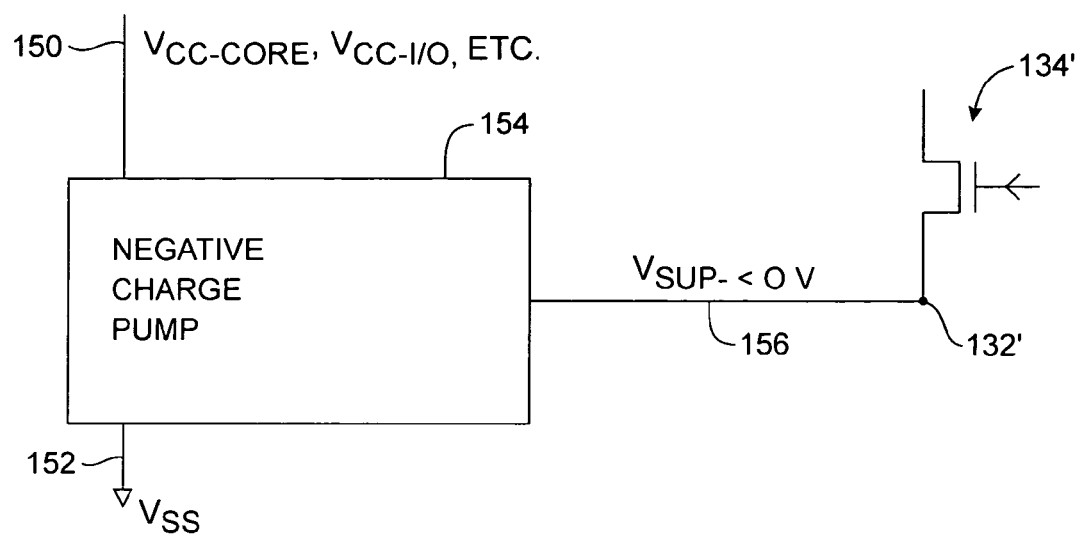
FIG. 14 is a schematic circuit diagram of an illustrative negative charge pump circuit that may be used to provide a negative supply voltage for an NMOS differential input buffer in accordance with the present invention.

An illustrative arrangement that may be used to provide a negative Vsup– voltage for H buffer 90 is shown in FIG. 14. As shown in FIG. 14, the current source transistor 134' of the H buffer 90 may be provided with a Vsup– voltage at terminal 132' that is negative (<0 V). This negative voltage may be produced by a negative charge pump 154.

Negative charge pump 154 may receive a ground signal at ground terminal 152. Negative charge pump 154 may also receive a positive voltage from one of the power supplies on integrated circuit 66 (or programmable logic device 103). The positive voltage used to power the negative charge pump 154 may be the core power supply voltage (Vcc-core), may be the I/O power supply voltage (Vcc-i/o), or any other suitable power supply voltage. The resulting output of the charge pump is a voltage Vsup– that is less than Vss. This voltage may be applied to the Vsup– terminal 132' of H buffer 90 to improve its lower input-voltage limit.

The voltage drop across the L-buffer can be made larger than Vcc-core–Vss while applying a voltage of Vcc-core–Vss across the H-buffer. If desired, the total power supply voltage drop across the L-buffer can be made equal to Vcc-core–Vss, while increasing the voltage across the H-buffer to more than Vcc-core–Vss. The voltages across both buffers may also be made larger than the magnitude of Vcc-core–Vss.

The performance of the differential input buffer circuitry is also enhanced by eliminating the use of a third input buffer such as buffer 14 of FIG. 1. Without the capacitive loading associated with a third buffer, the buffers can respond to input signals more quickly, which improves the bandwidth-handling capabilities of the input buffer circuitry.

The foregoing is merely illustrative of the principles of this invention and various modifications can be made by those skilled in the art without departing from the scope and spirit of the invention.

What is claimed is:

1. Differential input buffer circuitry on an integrated circuit for receiving a differential input signal supplied to a pair of inputs on the integrated circuit from an external component, wherein the integrated circuit has core logic that is powered using a core-logic power supply voltage, comprising:
    a first differential input buffer that receives the differential input signal supplied to the pair of inputs; and
    a second differential input buffer that receives the differential input signal supplied to the pair of inputs, wherein the first and second differential input buffers are connected in parallel and have respective total power supply voltage drops and wherein the total power supply voltage drop across at least the first differential input buffer is greater than the core-logic power supply voltage.

2. The differential input buffer circuitry defined in claim 1 further comprising power supply terminals connected to the second differential input buffer across which the total power supply voltage drop of the second differential input buffer is applied, wherein the total power supply voltage drop of the second differential input buffer is equal to the core-logic power supply voltage.

3. The differential input buffer circuitry defined in claim 1 wherein the first and second differential input buffers have power supply terminals and are configured to handle low-voltage-differential-signaling (LVDS) differential input signals.

4. The differential input buffer circuitry defined in claim 1 wherein the first differential input buffer comprises power supply terminals and is configured to handle common-mode voltages in the range of 0 volts to 1.1 volts.

5. The differential input buffer circuitry defined in claim 1 wherein the second differential input buffer comprises power supply terminals and is configured to handle common-mode voltages in the range of 0.9 volts to 3 volts.

6. The differential input buffer circuitry defined in claim 1 wherein the first and second differential input buffers comprise power supply terminals, wherein the first differential input buffer is configured to handle common-mode voltages in the range of 0 volts to 1.1 volts and wherein the second differential input buffer is configured to handle common-mode voltages in the range of 0.9 volts to 3 volts.

7. The differential input buffer circuitry defined in claim 1 wherein the first and second differential input buffers are connected to a pair of input pins and wherein there are no other input buffers connected in parallel to the pair of input pins with the first and second differential input buffers.

8. The differential input buffer circuitry defined in claim 1 wherein the first differential input buffer comprises:
    a current source;
    load and output circuitry that provides a single-ended output signal corresponding to the differential input signal; and
    a pair of differential p-channel metal-oxide-semiconductor transistors input transistors having source and drain terminals coupled between the current source and the load and output circuitry.

9. The differential input buffer circuitry defined in claim 1 wherein the second differential input buffer comprises:
    a current source;
    load and output circuitry that provides a single-ended output signal corresponding to the differential input signal; and
    a pair of differential n-channel metal-oxide-semiconductor transistors input transistors having source and drain terminals coupled between the current source and the load and output circuitry.

10. The differential input buffer circuitry defined in claim 1 wherein the second differential input buffer comprises:
    a current source;
    load and output circuitry that provides a single-ended output signal corresponding to the differential input signal; and
    a pair of differential n-channel metal-oxide-semiconductor transistors input transistors having source and drain terminals coupled between the current source and the load and output circuitry, wherein there is a power supply voltage drop across the current source, source and drain terminals, and load and output circuitry that is equal to the total power supply voltage drop across the second differential input buffer and that is greater than the core-logic power supply voltage.

11. The differential input buffer circuitry defined in claim 1 wherein the first differential input buffer comprises a pair of differential p-channel metal-oxide-semiconductor transistors and wherein the second differential input buffer comprises a pair of differential n-channel metal-oxide-semiconductor transistors.

12. The differential input buffer circuitry defined in claim 1 wherein the second differential input buffer comprises a pair of differential n-channel metal-oxide-semiconductor transistors and has power supply terminals to which a positive power supply voltage and a ground power supply voltage are respectively applied.

13. The differential input buffer circuitry defined in claim 1 wherein the second differential input buffer comprises a pair of differential n-channel metal-oxide-semiconductor transistors and has power supply terminals to which a positive power supply voltage and a negative power supply voltage are respectively applied.

14. The differential input buffer circuitry defined in claim 1 wherein the first differential input buffer comprises a pair of differential p-channel metal-oxide-semiconductor transistors and has power supply terminals across which an input-output power supply voltage is applied.

15. The differential input buffer circuitry defined in claim 1 wherein:
the second differential input buffer comprises a pair of differential n-channel metal-oxide-semiconductor transistors and has power supply terminals to which a positive power supply voltage and a negative power supply voltage are respectively applied; and
the first differential input buffer comprises a pair of differential p-channel metal-oxide-semiconductor transistors and has power supply terminals across which an input-output power supply voltage is applied.

16. The differential input buffer circuitry defined in claim 1 wherein the first differential input buffer comprises a pair of differential p-channel metal-oxide-semiconductor transistors and has power supply terminals across which an input-output power supply voltage is applied and wherein the differential p-channel metal-oxide-semiconductor transistors have gates to which signals are applied to turn off the first differential input buffer when not in use.

17. The differential input buffer circuitry defined in claim 1 wherein the first differential input buffer comprises a pair of differential p-channel metal-oxide-semiconductor transistors and has power supply terminals across which an input-output power supply voltage is applied and wherein the differential p-channel metal-oxide-semiconductor transistors have gates to which level-shifted control signals are applied.

18. The differential input buffer circuitry defined in claim 1 wherein the first differential input buffer comprises a pair of differential p-channel metal-oxide-semiconductor transistors and has power supply terminals across which an input-output power supply voltage is applied and wherein the differential p-channel metal-oxide-semiconductor transistors have gates to which at least one control signal from a programmable memory cell is applied.

19. The differential input buffer circuitry defined in claim 1 further comprising at least one pair of n-channel metal-oxide-semiconductor transistors, wherein the integrated circuit is a microprocessor.

20. The differential input buffer circuitry defined in claim 1 further comprising at least one pair of n-channel metal-oxide-semiconductor transistors, wherein the integrated circuit is a programmable logic device.

* * * * *